United States Patent
Kamo (10) Patent No.: US 9,841,667 B2
(45) Date of Patent: Dec. 12, 2017

(54) REFLECTIVE PHOTOMASK, METHOD FOR MANUFACTURING SAME AND PROGRAM FOR MAKING MASK PATTERN

(71) Applicant: Toshiba Memory Corporation, Tokyo (JP)

(72) Inventor: Takashi Kamo, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 102 days.

(21) Appl. No.: 14/844,469

(22) Filed: Sep. 3, 2015

(65) Prior Publication Data
US 2016/0274452 A1    Sep. 22, 2016

(30) Foreign Application Priority Data
Mar. 16, 2015    (JP) .................................. 2015-051706

(51) Int. Cl.
G03F 1/24    (2012.01)
G03F 1/70    (2012.01)

(52) U.S. Cl.
CPC . *G03F 1/24* (2013.01); *G03F 1/70* (2013.01)

(58) Field of Classification Search
None
See application file for complete search history.

(56) References Cited

U.S. PATENT DOCUMENTS

| 7,177,010 B2 | 2/2007 | Van Der Laan et al. |
| 7,906,257 B2 | 3/2011 | Itoh |
| 2006/0092397 A1 | 5/2006 | Laan et al. |
| 2008/0311486 A1 | 12/2008 | Itoh |
| 2015/0098069 A1* | 4/2015 | Lu ...................... G03F 7/70158 355/67 |

FOREIGN PATENT DOCUMENTS

| JP | 11-52540 | 2/1999 |
| JP | 2004-54092 | 2/2004 |
| JP | 2003-158056 | 7/2008 |

* cited by examiner

*Primary Examiner* — Stephen Rosasco
(74) *Attorney, Agent, or Firm* — Finnegan, Henderson, Farabow, Garrett & Dunner, L.L.P.

(57) ABSTRACT

A reflective photomask includes a substrate and a reflective layer on the substrate. The reflective layer has a top surface opposite to the substrate and a reflectivity distribution on the top surface. The reflective layer includes mask patterns, the mask patterns having sizes depending on the reflectivity distribution. The mask patterns include a first pattern and a second pattern, the first pattern having a first space size smaller than a second space size of the second pattern. The first pattern is provided in a first region of the top surface, and the second pattern is provided in a second region of the top surface, wherein a reflectivity in the first region is lower than a reflectivity in the second region.

13 Claims, 11 Drawing Sheets

REFLECTIVE PHOTOMASK, METHOD FOR MANUFACTURING SAME AND PROGRAM FOR MAKING MASK PATTERN

CROSS-REFERENCE TO RELATED APPLICATIONS

This application is based upon and claims the benefit of priority from Japanese Patent Application No. 2015-051706, filed on Mar. 16, 2015; the entire contents of which are incorporated herein by reference.

FIELD

Embodiments are generally related to a reflective photomask, a method for manufacturing the same and a program for making a mask pattern.

BACKGROUND

A lithography technique using a EUV light (Extreme Ultra Violet light) in the wavelength range around 13.5 nm is being developed for manufacturing a semiconductor device with a fine structure, such as a MEMS (Micro Electro Mechanical Systems), and the like. A reflective photomask used for the lithography in the extremely-short wavelength region comprises, for example, a multilayer film mirror, which includes alternately stacked molybdenum (Mo) layer and silicon (Si) layer, and a light-absorbing body. Further, such a reflective photomask is required to have a high-level uniformity in a pattern size thereof.

BRIEF DESCRIPTION OF THE DRAWINGS

FIGS. 2A to 3B are schematic cross-sectional views showing a manufacturing process of the reflective photomask according to the embodiment;

FIGS. 7A to 9B are graphs showing characteristics of the exposure apparatus according to the embodiment;

DETAILED DESCRIPTION

According to an embodiment, a reflective photomask includes a substrate and a reflective layer on the substrate. The reflective layer has a top surface opposite to the substrate and a reflectivity distribution on the top surface. The reflective layer includes mask patterns, the mask patterns having sizes depending on the reflectivity distribution. The mask patterns include a first pattern and a second pattern, the first pattern having a first space size smaller than a second space size of the second pattern. The first pattern is provided in a first region of the top surface, and the second pattern is provided in a second region of the top surface, wherein a reflectivity in the first region is lower than a reflectivity in the second region.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
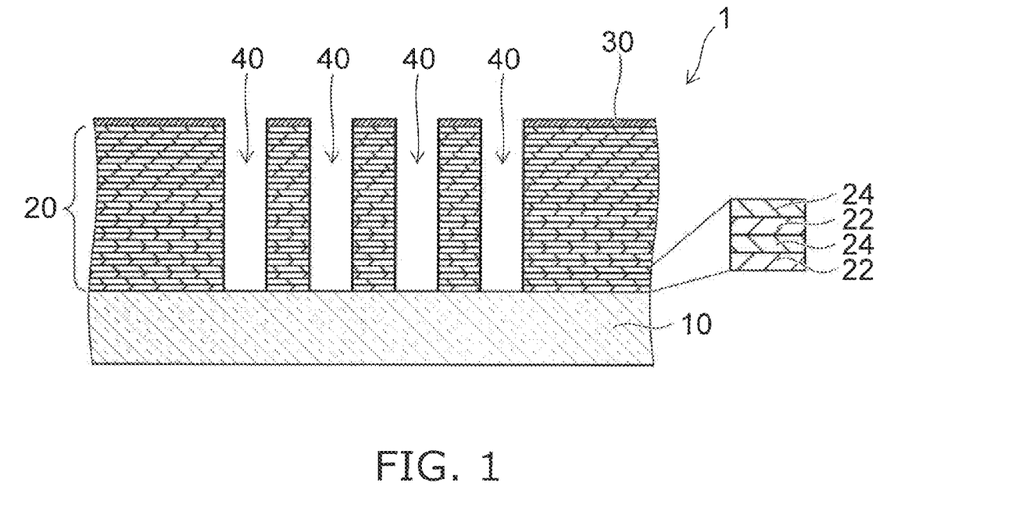
FIG. 1 is a schematic cross-sectional view showing a reflective photomask according to an embodiment.

FIG. 1 is a schematic cross-sectional view showing a reflective photomask 1 according to an embodiment. The reflective photomask 1 includes a substrate 10, a reflective layer 20, and a cap layer 30. The reflective layer 20 has a multilayer structure. The reflective layer 20 is provided on the substrate 10, and the cap layer 30 is provided on the reflective layer 20. The reflective photomask 1 includes a recessed portion 40 that is dug from an upper face of the cap layer 30 into the reflective layer 20. The recessed portion 40 acts as, for example, a light absorbing part or a lower reflection part. The substrate 10 is, for example, a transparent glass substrate.

The reflective layer 20 has a structure in which a first film 22 and a second film 24 are alternately stacked. The first film 22 differs in refractive index from the second film 24. That is, the reflective layer 20 has a multi-layer structure in which two layers each having a different refractive index are alternately stacked. The first film 22 is, for example, a molybdenum (Mo) film, for example, and the second film 24 is, for example, a silicon (Si) film. The cap layer 30 is, for example, a ruthenium (Ru) layer.

The recessed portion 40 has an opening that has a predetermined shape as a mask pattern in a top surface of the reflective layer 20. Although the recessed portion 40 has a structure obtained by digging the reflective layer 20 in this example, the embodiment is not limited thereto. For example, the reflective photomask 1 may have a structure, in which a material serving as a light absorber is selectively disposed on the reflective layer 20 instead of the recessed portion 40.

Furthermore, each recessed portion 40 in FIG. 1 represents a part of a predetermined mask pattern, for example. Hereinafter, a distance between the adjacent recessed portions 40 will be referred to as a space size of the mask pattern. Further, each recessed portion 40 may be a cross section of a sub-pattern included in a predetermined mask pattern, for example.

Next, referring to FIGS. 2A to 3B, a method for manufacturing the reflective photomask 1 according to the embodiment will be described. FIG. 2A to FIG. 3B are schematic cross-sectional views sequentially showing the manufacturing process of the reflective photomask 1.

Figure 2A:
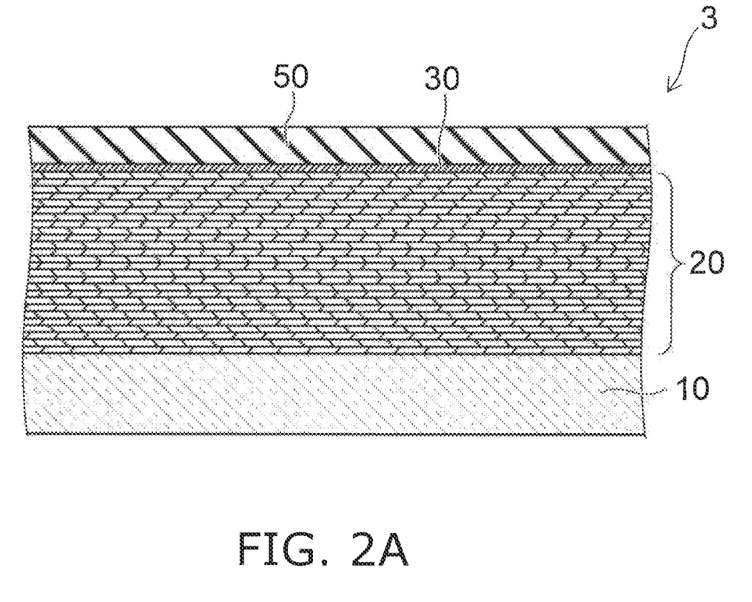

FIG. 2A shows a photomask blank 3 prepared. The photomask blank 3 includes, for example, the substrate 10, the reflective layer 20, the cap layer 30, and a hard mask 50. The cap layer 30 may be omitted in some instances. The hard mask 50 is provided on the cap layer 30. The hard mask 50 is, for example, an inorganic film that is capable of selectively removing from the cap layer 30 and reflective layer 20.

Figure 2B:
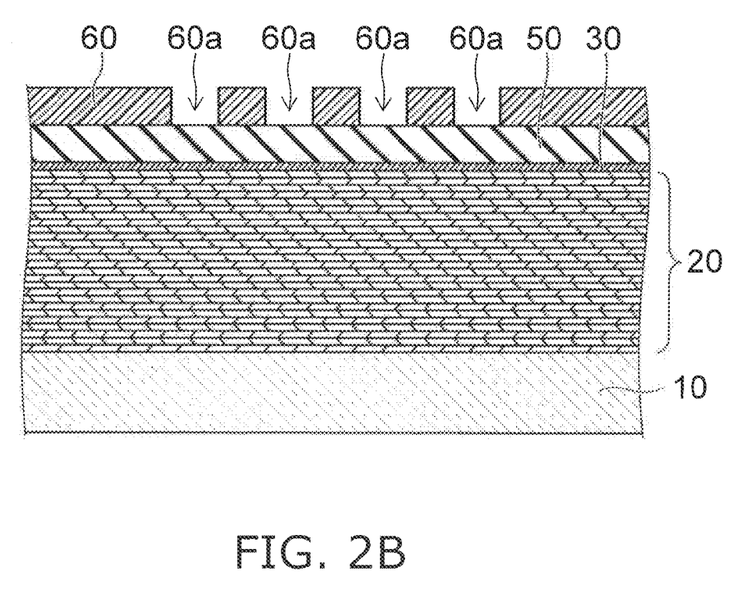

As shown in FIG. 2B, a resist mask 60 is formed on the hard mask 50. The resist mask 60 has, for example, an opening 60a. The opening 60a has a predetermined mask pattern shape in the top surface thereof. The resist mask 60 is, for example, a chemical amplification-type positive resist. The opening 60a is drawn on the resist film by using an electron beam (EB) exposure apparatus, and then, formed by developing the resist film, for example.

Figure 3A:
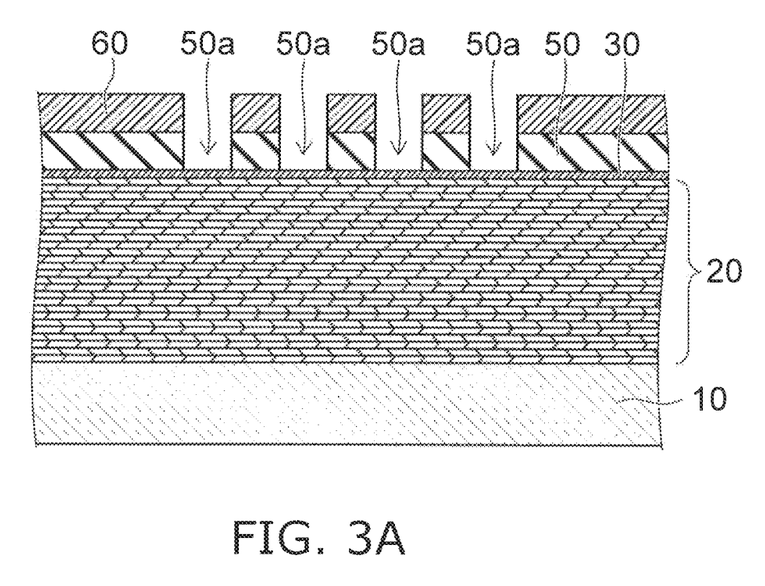

As shown in FIG. 3A, an opening 50a is formed by selectively removing the hard mask 50 using the resist mask 60. That is, the mask pattern of the resist mask 60 is transferred to the hard mask 50.

Figure 3B:
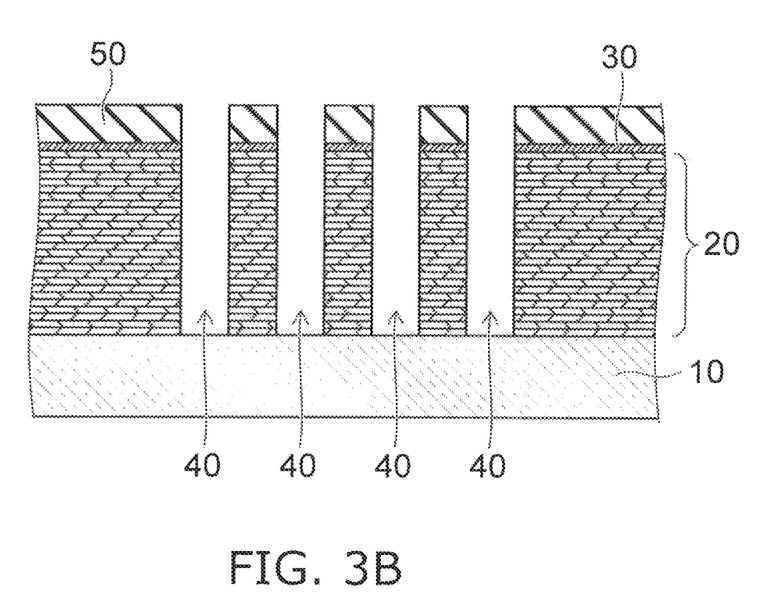

As shown in FIG. 3B, the recessed portion 40 is formed by selectively removing the reflective layer 20 using the hard mask 50. In this example, the substrate 10 is exposed in the bottom surface of the recessed portion 40 by removing the reflective layer 20 over the whole thickness thereof, but a part of the reflective layer 20 may be left below the bottom of the recessed portion 40. Then, the reflective photomask 1 is completed by removing the hard mask 50.

Figure 4:
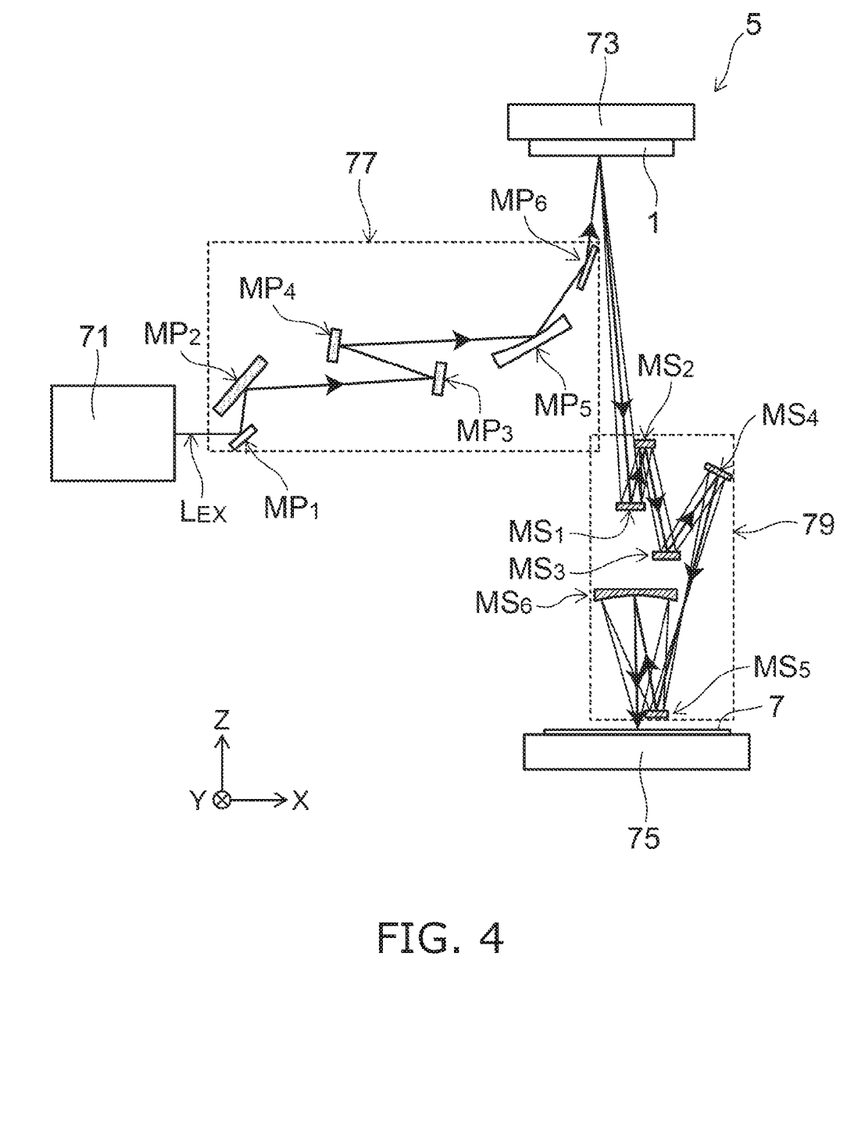
FIG. 4 is a schematic view showing an exposure apparatus according to the embodiment.

Next, referring to FIG. 4, an exposure apparatus 5 according to the embodiment will be described. FIG. 4 is a schematic view illustrating the exposure apparatus 5. The exposure apparatus 5 includes a light source 71, a mask stage 73, a wafer stage 75, an irradiation part 77, and a projection part 79.

The mask stage 73 holds, for example, the reflective photomask 1. For example, a wafer 7 coated with a photoresist is placed on the wafer stage 75.

The irradiation part 77 irradiates the reflective photomask 1 with an exposure light $L_{ex}$, which is emitted from the light source 71. The irradiation part 77 includes mirrors $MP_1$ to $MP_6$ to introduce the exposure light $L_{ex}$ to the reflective photomask 1.

The projection part 79 projects the mask pattern of the reflective photomask 1 onto the wafer 7. The projection part 79 includes mirrors $MS_1$ to $MS_6$ to focus the exposure light $L_{ex}$ onto the wafer 7.

Next, referring to FIG. 5 to FIG. 12, a method for adjusting a size of the mask pattern will be described according to the embodiment. In the following description, the shape of the light absorbing part or the lower reflection part in the top surface of the reflective layer 20 is referred to as the "mask pattern", for example. That is, the "mask pattern" is a shape of the opening of the recessed portion 40, for example. Further, the distance between the adjacent recessed portions 40, i.e., the width of the reflective layer 20 between the adjacent recessed portions 40 is referred to as the "space size".

For example, when each recessed portion 40 corresponds to a part of the mask pattern, the space size may be a distance between the parts of the mask pattern. When each recessed portion 40 corresponds to a sub-pattern that is included in the mask pattern, the space size may be a distance between the sub-patterns.

Figure 5:
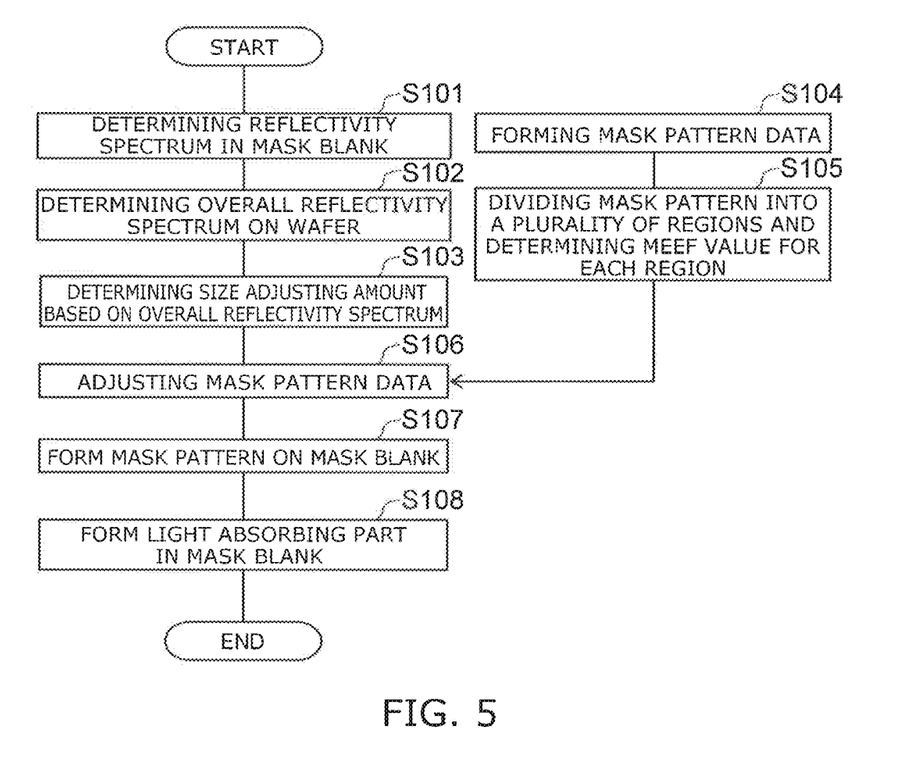
FIG. 5 is a flow chart showing a method of manufacturing the reflective photomask according to the embodiment.

FIG. 5 is a flowchart showing the method for adjusting a size of the mask pattern according to the embodiment.

Hereinafter, steps S101 to S108 for adjusting the mask pattern size shown in FIG. 5 will be sequentially described.

Figure 6A:
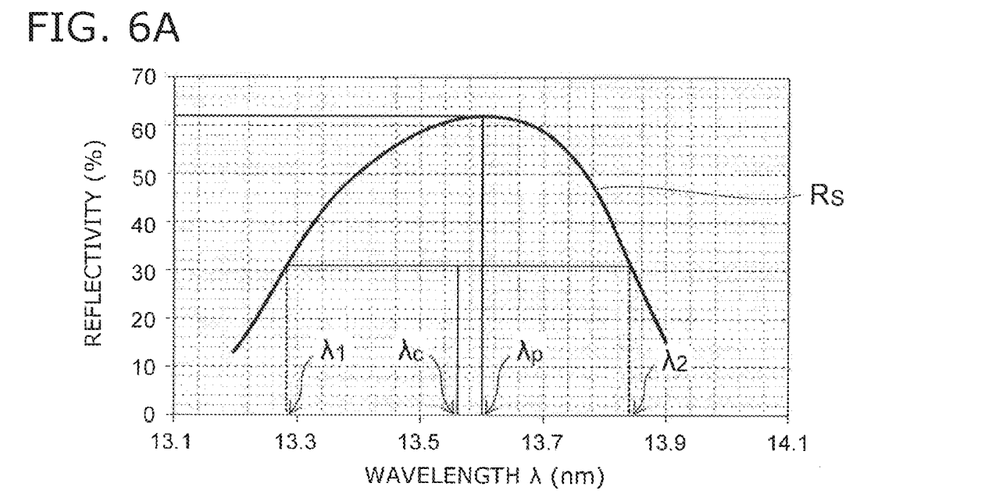
FIGS. 6A to 6C are schematic views showing a property of a photomask blank according to the embodiment.

Step S101: A distribution of reflectivity in the photomask blank 3 is determined. For example, FIG. 6A is a graph illustrating a reflectance spectrum $R_S$ of the photomask blank 3 in the EUV wavelength region. The horizontal axis represents the wavelength, and the vertical axis represents the reflectivity. The reflectance spectrum $R_S$ is one example in a region among a plurality of regions which divides a surface of the photomask blank 3.

As shown in FIG. 6A, the reflectivity of the photomask blank 3 depends on a wavelength of incident light, and has a peak at approximately 13.5 nanometer. Here, the peak wavelength is designated by $\lambda_P$, and a center wavelength of the reflectance spectrum $R_S$ is designated by $\lambda_C$. When the half-value wavelengths are designated by $\lambda_1$ and $\lambda_2$, at which the reflectivity becomes half the peak value, the center wavelength $\lambda_C$ is a center between $\lambda_1$ and $\lambda_2$. As shown in FIG. 6A, a peak wavelength $\lambda_P$ does not always coincide with the center wavelength $\lambda_C$.

Figure 6B:
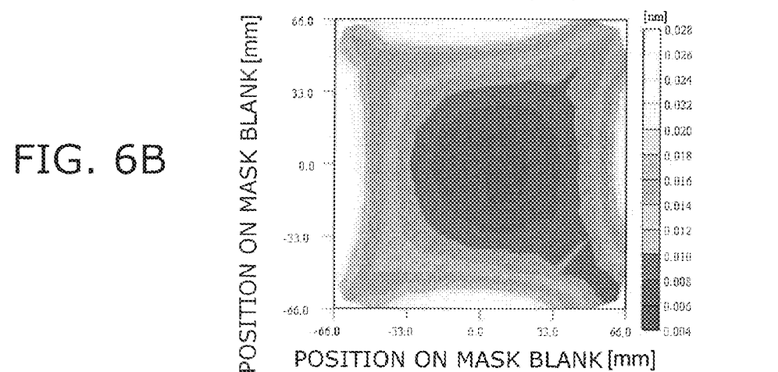

FIG. 6B illustrates a distribution of the center wavelengths $\lambda_C$ on the surface of the photomask blank 3. The horizontal axis and vertical axis represent the coordinates with a center of the photomask blank 3 as an origin.

Figure 6C:
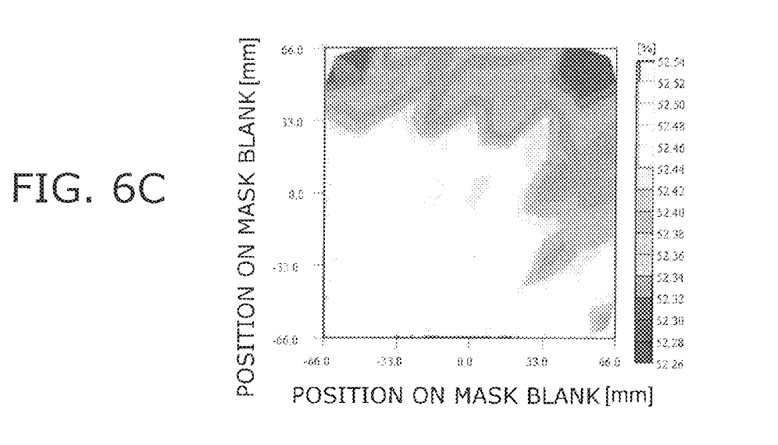

FIG. 6C illustrates a distribution of the peak values of the reflectivity on the surface of the photomask blank 3. The horizontal axis and the vertical axis represent the coordinates with the center of the photomask blank 3 as the origin.

As shown in FIGS. 6B and 6C, the peak value and the center wavelength $\lambda_C$ of the reflectance spectrum $R_S$ are distributed in the surface of the photomask blank 3. Further, it may be found that the distribution of center wavelengths $\lambda_C$ and the distribution of the peak values of the reflectance spectrum $R_S$ do not always coincide with each other.

Step S102: An overall reflectivity is calculated at the wafer 7, i.e. an end of a path of the exposure light $L_{ex}$. Here, a ratio of an intensity of the exposure light $L_{ex}$ at the surface of the wafer 7 to an intensity of the exposure light $L_{ex}$ emitted from the light source 71 is referred to as the "overall reflectivity" or "overall reflectance". That is, the "overall reflectivity" is an overall cumulative product of reflectivities through the exposure light path, which includes the reflective mirrors $MP_1$ to $MP_6$ in the irradiation part 77, the reflective photomask 1, and the reflective mirrors $MS_1$ to $MS_6$ in the projection part 79.

Figure 7A:
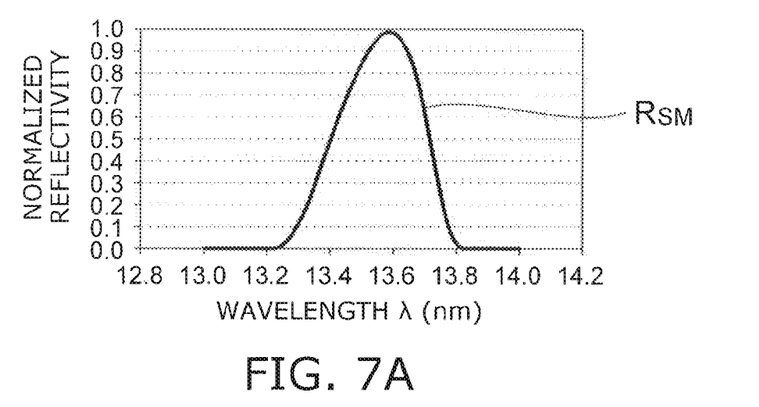

For example, FIG. 7A shows a reflectance spectrum $R_{SM}$ that is obtained by multiplying a reflectance spectrum of the irradiation part 77 by a reflectance spectrum of the projection part 79. The horizontal axis represents the wavelength of the exposure light $L_{ex}$, and the vertical axis represents the normalized reflectivity.

Figure 7B:
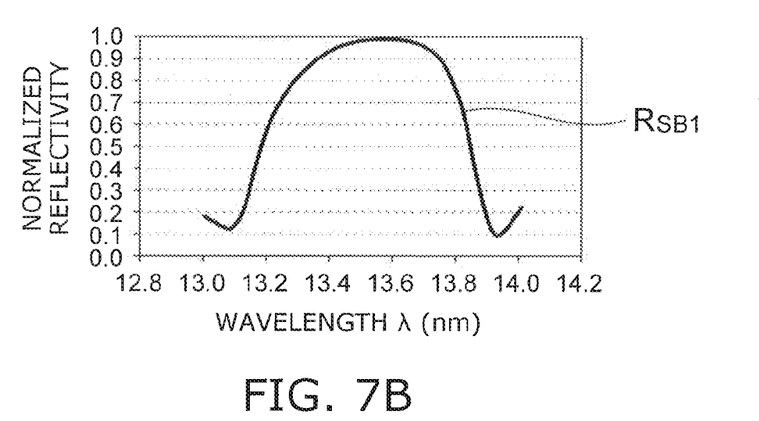

FIG. 7B shows a reflectance spectrum $R_{SB1}$ of the photomask blank 3. The horizontal axis represents the wavelength of exposure light $L_{ex}$, and the vertical axis represents the normalized reflectivity. For example, the surface of the photomask blank 3 is divided into the regions each having 1 mm square, and the reflectance spectrum $R_{SB1}$ is determined in one of the regions. The horizontal axis represents the wavelength of exposure light $L_{ex}$, and the vertical axis represents the normalized reflectivity.

Figure 7C:
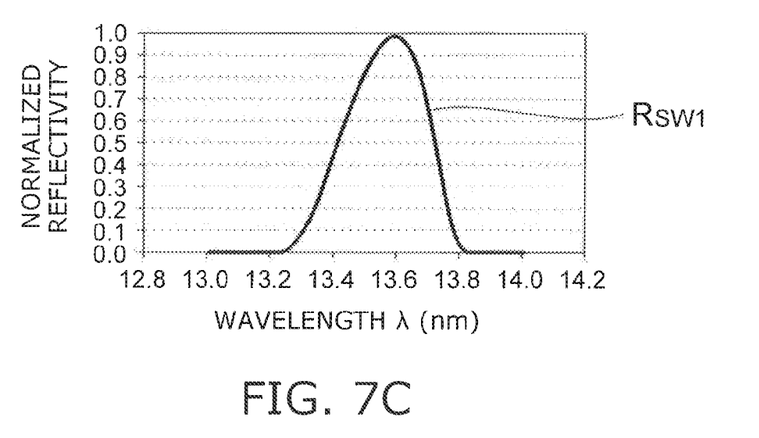

FIG. 7C shows an overall reflectance spectrum $R_{SW1}$ obtained by multiplying the reflectance spectrum $R_{SM}$ by the reflectance spectrum $R_{SB1}$. The horizontal axis represents the wavelength of exposure light and the vertical axis represents the normalized reflectivity.

Figure 8A:
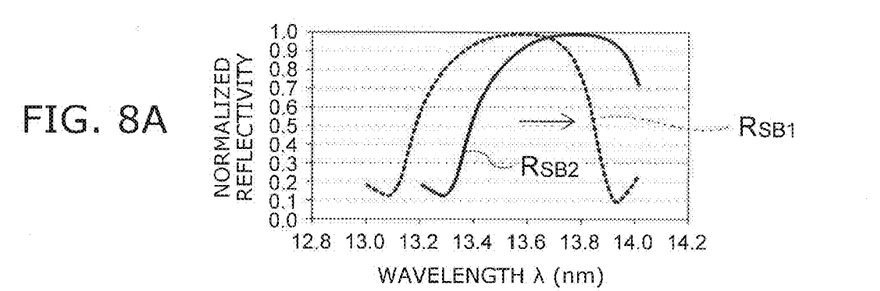

FIG. 8A shows another reflectance spectrum $R_{SB2}$ of the photomask blank 3. The horizontal axis represents the wavelength of exposure light $L_{ex}$, and the vertical axis represents the normalized reflectivity. The reflectance spectrum $R_{SB2}$ is normalized by the peak value of the reflectance spectrum $R_{SB1}$ shown in FIG. 7B. Further, the reflectance spectrum $R_{SB2}$ is determined in another region different from the one region in which the reflectance spectrum $R_{SB1}$ is determined. As shown in FIG. 8A, the reflectance spectrum $R_{SB2}$ shifts to a longer wavelength side than the reflectance spectrum $R_{SB1}$.

Figure 8B:
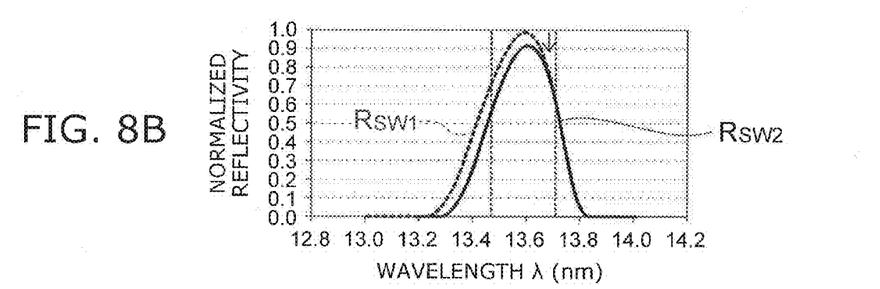

FIG. 8B shows another overall reflectance spectrum $R_{SW2}$ obtained by multiplying the reflectance spectrum $R_{SM}$ by the reflectance spectrum $R_{SB2}$. The horizontal axis represents the wavelength of exposure light $L_{ex}$, and the vertical axis represents the normalized reflectivity. The overall reflectance spectrum $R_{SW2}$ is normalized by the peak value of the overall reflectance spectrum $R_{SW1}$ shown in FIG. 7C.

As shown in FIG. 8B, a peak value of the overall reflectance spectrum $R_{SW2}$ decreases as compared with the peak value of the overall reflectance spectrum $R_{SW1}$. That is, the peak value of the overall reflectance spectrum $R_{SW}$ is found to decrease due to a shift of the center wavelength $\lambda_C$ of the reflectance spectrum in the photomask blank 3.

Figure 9A:
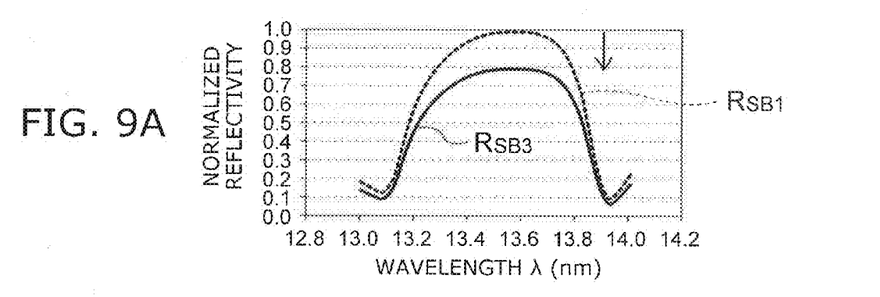

FIG. 9A shows other reflectance spectrum $R_{SB3}$ of the photomask blank 3. The horizontal axis represents the wavelength of exposure light $L_{ex}$, and the vertical axis represents the normalized reflectivity. The reflectance spectrum $R_{SB3}$ is normalized by the peak value of the reflectance spectrum $R_{SB1}$ shown in FIG. 7B. The reflectance spectrum $R_{SB3}$ is determined in other region different from the regions in which the reflectance spectrum $R_{SB1}$ and the reflectance spectrum $R_{SB2}$ are determined respectively. As shown in FIG. 9A, the reflectance spectrum $R_{SB3}$ has a peak value of the reflectivity smaller than the reflectance spectrum $R_{SB1}$.

Figure 9B:
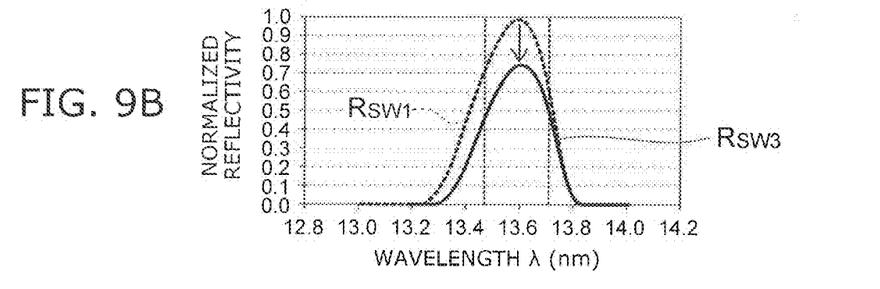

FIG. 9B shows other overall reflectance spectrum $R_{SW3}$ obtained by multiplying the reflectance spectrum $R_{SM}$ by the reflectance spectrum $R_{SB3}$. The horizontal axis represents the wavelength of exposure light $L_{ex}$, and the vertical axis represents the normalized reflectivity. The overall reflectance spectrum $R_{SW3}$ is normalized by the peak value of the overall reflectance spectrum $R_{SW1}$ shown in FIG. 7C.

As shown in FIG. 9B, a peak value of the overall reflectance spectrum $R_{SW3}$ is smaller than the peak value of the overall reflectance spectrum $R_{SW1}$. That is, the peak value of the overall reflectance spectrum $R_{SW}$ is found to be decreased as the peak value of the reflectance spectrum $R_{SB}$ of the photomask blank 3 becomes lower.

As described above, the peak value of the overall reflectivity may changes due to a shift of the center wavelength $\lambda_C$ or a fluctuation of the peak value in the reflectance spectrum $R_{SB}$ of the photomask blank 3. Accordingly, the overall reflectivity on the wafer 7 may be calculated more accurately by determining the reflectance spectrum $R_{SB}$ in each region that divides the surface of the photomask blank, comparing with a case where a distribution of reflectivity in the surface of the photomask blank 3 is determined at a specific wavelength.

Figure 10:
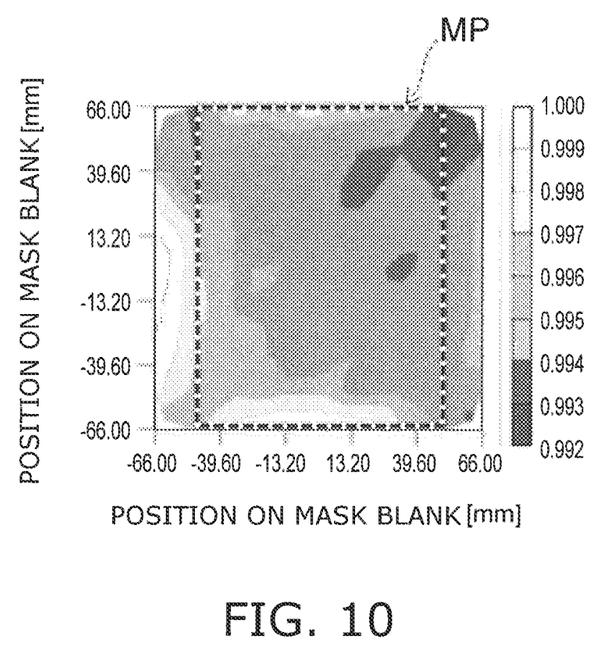
FIG. 10 is a schematic view showing a distribution of an overall reflectivity against exposure light corresponding to positions in the photomask blank according to the embodiment.

FIG. 10 shows a distribution of overall reflectivity corresponding to a coordinate on the photomask blank 3. The overall reflectivity shown in FIG. 10 is an integrated value obtained by integrating the overall reflectance spectrum $R_{SW}$ over the wavelength in each region of the photomask blank 3. That is, FIG. 10 shows a distribution of areas of the overall reflectance spectrum $R_{SW}$ at each coordinate on the photomask blank 3. A region MP shown in FIG. 10 indicates, for example, a region in which the recessed portion 40 is formed. The region MP has a size of 104 mm×132 mm, for example.

Step S103: Adjusting amounts of the mask pattern size are calculated using the overall reflectivity shown in FIG. 10.

Figure 11A:
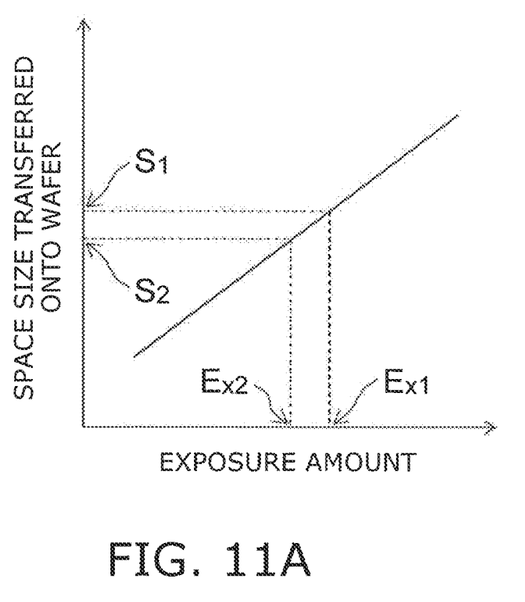
FIGS. 11A and 11B are schematic views showing relationships between a pattern size on a wafer and an exposure amount and between a pattern size on a wafer and a mask pattern size.

FIG. 11A is a graph illustrating a relationship between an exposure amount and the space size in a pattern transferred onto the wafer 7, when the space size in a mask pattern is set constant. The horizontal axis represents the exposure amount and the vertical axis represents the space size in the pattern transferred onto the wafer 7. The exposure amount is a product of intensity of the exposure light $L_{ex}$ and an exposure time. For example, an exposure amount $E_{X1}$ in a first region is larger than an exposure amount $E_{X2}$ in a second region, when an overall reflectivity corresponding to the first region is larger than an overall reflectivity corresponding to the second region. Thus, a space size $S_1$ transferred from the first region becomes larger than a space size $S_2$ transferred from the second region.

Figure 11B:
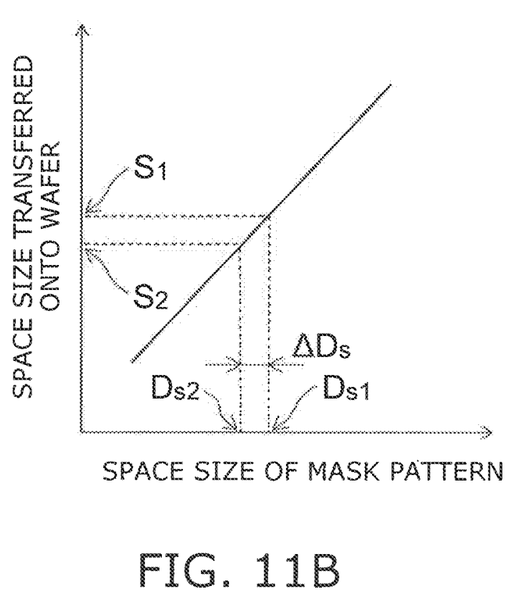

FIG. 11B is a graph showing a relationship between a space size in a mask pattern and a space size in a pattern transferred onto the wafer 7, when the exposure amount is set constant. It can be said that the space size in a mask pattern is a design value. That is, the horizontal axis represents the design value of the space size, and the vertical axis represents the space size in the pattern transferred onto the wafer 7.

For example, the space size $S_1$ in a pattern transferred onto the wafer 7 corresponds to a design value $D_{S1}$, and the space size $S_2$ in another pattern transferred onto the wafer 7 corresponds to a design value $D_{S2}$. When making the space sizes $S_1$ and $S_2$ to be coincident with each other, a difference $\Delta D_S$ between the design values $D_{S1}$ and $D_{S2}$ can be used as an adjusting amount. For example, the space size $S_1$ is made to be coincident with the space size $S_2$ by narrowing the space size $D_{S1}$ in the first region by the adjusting amount $\Delta D_S$. Alternatively, the space size $D_{S2}$ in the second region may be enlarged by the adjusting amount $\Delta D_S$.

Figure 12:
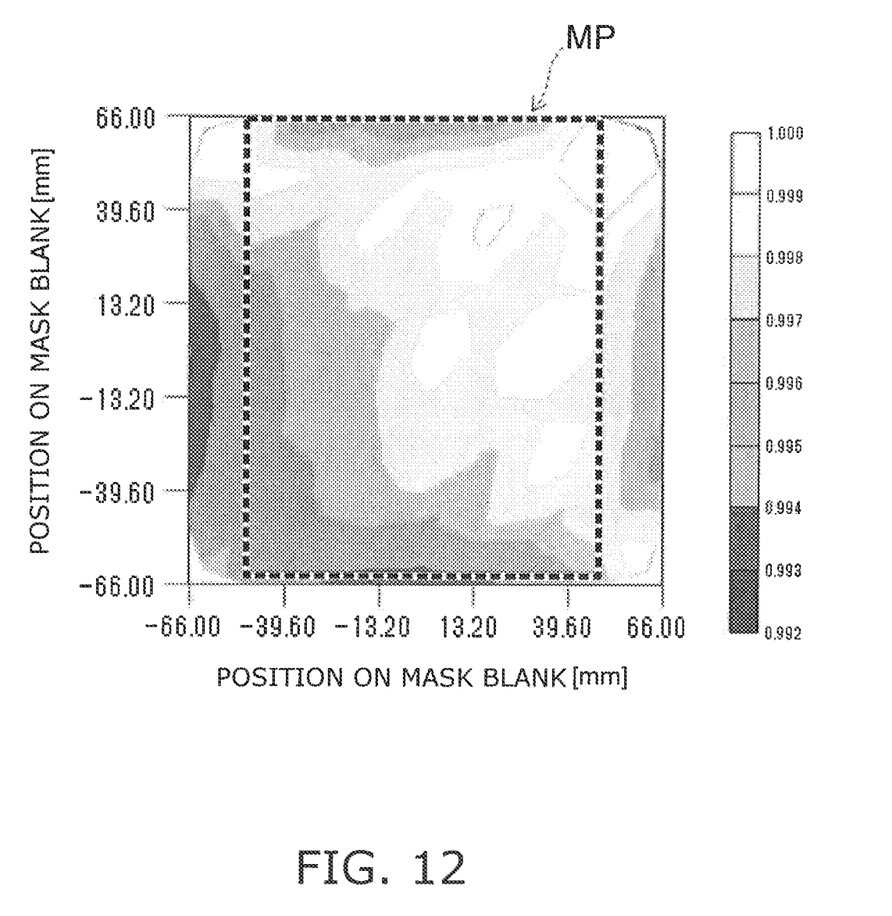
FIG. 12 is a schematic view showing a distribution of size adjustment factors of a mask pattern corresponding to positions in the photomask blank according to the embodiment.

FIG. 12 shows a distribution of the adjusting amount in the surface of the photomask blank 3. FIG. 12 shows the adjusting amount corresponding to the coordinates with an origin thereof at the center of the photomask blank 3. A size adjusting coefficient ($=[D_S-\Delta D_S]/D_S$) is shown in this example, wherein a space size $D_S$ is a design value corresponding to the smallest overall reflectivity (see FIG. 10). It is found that the size adjusting coefficient decreases as the overall reflectivity increases, comparing the distribution of overall reflectivity in FIG. 10 with the distribution of size adjusting coefficients in FIG. 12.

Step S104: Data is derived to form a mask pattern in the photomask blank 3. The mask pattern is designed and quantified for storing the mask pattern data in a database, for example.

Step S105: The whole mask pattern that is to be formed in the region MP of the photomask blank 3 is divided into a plurality of regions, and each region includes a part of the whole mask pattern. The whole mask pattern may have a plurality of mask patterns, for example. An MEEF (Mask Error Enhancement Factor) value is calculated for each region. For example, the whole mask pattern is divided into a plurality of portions each having an area of 1 mm square, and the MEEF value is calculated for each portion. For example, the MEEF value is calculated on the basis of an average line width or an average space size in each portion of the whole mask pattern.

The "MEEF value" is a factor obtained by dividing a first deviation amount of a first mask pattern transferred onto a wafer by a second deviation amount of a second mask pattern on a photomask, for example, wherein the first deviation amount is a difference in size between a first mask pattern and a designed mask pattern, and the second deviation amount is a difference in size between the second mask pattern and the designed mask pattern. By adjusting the designed size of the mask pattern on the basis of the MEEF value, non-uniformity due to inaccuracy in the manufacturing process of the reflective photomask 1 is suppressed in the transfer pattern on the wafer, for example.

Step S106: The mask pattern data is adjusted. For example, the mask pattern data is adjusted using a size adjusting coefficient at each coordinate of the photomask blank 3 shown in FIG. 12. Furthermore, the mask pattern data is adjusted using the MEEF value in each region of the photomask blank 3 corresponding to each portion of the whole mask pattern. The uniformity of the mask pattern transferred onto the wafer may be further improved by adjusting the mask pattern data using the MEEF value.

The MEEF value becomes larger as the space size decreases, for example. Accordingly, in a region having a smaller space size, the mask pattern data is adjusted so that the space size becomes wider. The MEEF value is the same in the portions that have the same design value of the space size. Thus, the adjustment using the overall reflectivity makes the space size wider in a region where the overall reflectivity is smaller, and narrower in a region where the overall reflectivity is larger. For example, the minimum space size corresponding to the resolution limit of EB exposure apparatus is set to be wider in the region where the overall reflectivity is smaller.

Step S107: A mask pattern is formed using an EB exposure apparatus. For example, the mask pattern data adjusted using the overall reflectivity and MEEF value is stored in a database of the EB exposure apparatus, and a resist film formed on the photomask blank 3 is subjected to EB exposure on the basis of the mask pattern data. Then, the resist mask 60 is formed on the photomask blank 3 (see FIG. 2B).

Step S108: The light absorbing part (or the low reflection part) is formed in the photomask blank 3. For example, as shown in FIG. 3B, after transferring the mask pattern to the hard mask 50, the recessed portion 40 serving as the light absorbing part is formed by selectively removing the reflective layer 20.

For example, light absorbing parts are formed in the photomask blank 3. Each light absorbing part has a sub pattern in the top surface of the reflective layer 20 with a space size depending on the reflectivity of a portion in which each light absorbing part is provided. For example, the minimum space size between first sub patterns that are provided in a portion having a first reflectivity is wider than the minimum space size between second sub patterns that are provided in a portion that has a second reflectivity, wherein the second reflectivity is higher than the first reflectivity. Further, when the first sub pattern and the second sub pattern each have a similarity shape, the space size between the first sub patterns is wider than the space size corresponding thereto in the second sub patterns. Furthermore, the second reflectivity may be lower than the reflectivity in the other portion. The space size between the second sub patterns is wider than the space size between the sub patterns in the other portion.

The above-described steps S102, S103, S105, and S106 are executed by, for example, a computer. A CPU of the computer executes a program including: a process of calculating an overall reflectivity based on a reflectance spectrum measured in each of a plurality of portions on the surface of a reflective layer and based on an overall reflectance spectrum of the exposure apparatus; a process of calculating an MEEF value of a mask pattern formed in each of the plurality of portions; and a process of adjusting a size of the mask pattern using the overall reflectivity and the MEEF value in each of the plurality of portions. In addition, the above-described processes may be executed by, for example, a microprocessor in a control part of the exposure apparatus.

In the method for manufacturing a reflective photomask according to the embodiment, the size of a mask pattern is adjusted on the basis of the overall reflectivity. Therefore, the uniformity may be improved in a whole mask pattern transferred onto the wafer 7. Furthermore, the uniformity of the transferred pattern may be further improved by adjusting the size of the mask pattern using the MEEF value.

In the method for manufacturing a reflective photomask according to the embodiment, it may become possible to use the photomask blank that is regarded as out of specification in the reflectivity distribution. Thus, the reflective photomask 1 may be manufactured with a lower cost. Furthermore, TAT (Turn Around Time) may also be reduced in the manufacturing process of the photomask blank 3.

In the example described above, although the light absorbing part is provided with a shape of the mask pattern, the embodiment is not limited thereto. For example, the reflective layer 20 may have a shape of the mask pattern in the upper surface thereof. In such a case, a width of the mask pattern is defined instead of the space size, wherein the mask pattern in a portion with higher reflectivity is provided with a narrower width.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A reflective photomask to be provided between a light source and an object to project mask patterns of the reflective photomask on the object using exposure light emitted from a light source, the exposure light propagating through an irradiation part and a projection part via the reflective photomask, the irradiation part being provided between the light source and the reflective photomask to introduce the exposure light to the reflective photomask, and the projection part being provided between the reflective photomask and the object to focus the exposure light onto the object, the reflective photomask comprising:

a substrate; and a reflective layer on the substrate, the reflective layer having a top surface opposite to the substrate and including the mask patterns, the mask patterns including a first pattern provided in a first region comprising first plural patterns apart from each other with a first space size and a second pattern provided in a second region comprising second plural patterns apart from each other with a second space size larger than the first space size, the difference of the first space size and the second space size being determined based on an overall reflectivity, the overall reflectivity representing a ratio of an intensity of the exposure light on the object to an intensity of the exposure light at the light source, and the overall reflectivity having a first value at the first region and a second value at the second region, the second value being larger than the first value.

2. The reflective photomask according to claim 1, wherein the second region has a maximum reflectivity on the top surface; and the second space size is a minimum size among space sizes included in the mask patterns.

3. The reflective photomask according to claim 1, wherein each of the mask patterns is an opening shape of a recessed portion provided in the reflective layer.

4. The reflective photomask according to claim 3, wherein the recessed portion extends through the reflective layer from the top surface to the substrate.

5. The reflective photomask according to claim 1, wherein the reflective layer has a structure in which a first film and a second film are stacked, and the second film is different in a refractive index from the first film.

6. The reflective photomask according to claim 1, wherein the substrate is a transparent glass substrate.

7. The reflective photomask according to claim 1, further comprising a cap layer provided on the reflective layer.

8. A method for manufacturing a reflective photomask to be provided between a light source and an object to project mask patterns of the reflective photomask on the object using exposure light emitted from a light source, the exposure light propagating through an irradiation part and a projection part via the reflective photomask, the irradiation part being provided between the light source and the reflective photomask to introduce the exposure light to the reflective photomask, and the projection part being provided between the reflective photomask and the object to focus the exposure light onto the object, the method comprising:

measuring a reflectance spectrum in a wavelength range of the exposure light respectively in a plurality of regions on a surface of a reflective layer of the reflective photomask;

determining an overall reflectivity in each of the plurality of regions based on the reflectance spectrum, the overall reflectivity representing a ratio of an intensity of the exposure light on the object to an intensity of the exposure light at the light source, and the overall reflectivity having a first value at the first region and a second value at the second region, the second value being larger than the first value; and adjusting a size of a mask pattern in each of the plurality of regions based on a distribution of the overall reflectivity.

9. The method according to claim 8, further comprising:
determining an MEEF value for the mask pattern in each of the plurality of regions; and
adjusting a size of the mask pattern using the MEEF value.

10. The method according to claim 8, wherein the overall reflectivity is a value obtained by integrating an overall reflectance spectrum over wavelength, the overall reflectance spectrum being obtained by multiplying the reflectance spectrum in each of the plurality of regions by the reflectance spectrum of the irradiation part and the projection part.

11. The method according to claim 8, wherein
the irradiation part and the projection part include a plurality of mirrors; and
the reflectance spectrum of the irradiation part and the projection part is an overall reflectance spectrum of the plurality of mirrors.

12. The method according to claim 8, wherein the exposure light is light in a EUV wavelength region.

13. The method according to claim 8, wherein the reflective layer has a first region and a second region, the first region having first plural patterns apart from each other with a first space size, and the second region having second plural patterns apart from each other with a second space size larger than the first space size.

* * * * *